(12) United States Patent
Jeong (10) Patent No.: US 11,430,639 B2
(45) Date of Patent: Aug. 30, 2022

(54) PLASMA PROCESSING SYSTEM

(71) Applicant: XIA TAI XIN SEMICONDUCTOR (QING DAO) LTD., Qingdao (CN)

(72) Inventor: Woohyun Jeong, Singapore (SG)

(73) Assignee: XIA TAI XIN SEMICONDUCTOR (QING DAO) LTD., Qingdao (CN)

(*) Notice: Subject to any disclaimer, the term of this patent is extended or adjusted under 35 U.S.C. 154(b) by 451 days.

(21) Appl. No.: 16/679,325

(22) Filed: Nov. 11, 2019

(65) Prior Publication Data

US 2020/0219707 A1 Jul. 9, 2020

Related U.S. Application Data

(60) Provisional application No. 62/778,932, filed on Dec. 13, 2018.

(51) Int. Cl.
*H01L 21/683* (2006.01)
*H01J 37/32* (2006.01)
*H01J 37/15* (2006.01)

(52) U.S. Cl.
CPC ........ *H01J 37/32724* (2013.01); *H01J 37/15* (2013.01); *H01L 21/6833* (2013.01); *H01L 21/6831* (2013.01)

(58) Field of Classification Search
CPC .................. H01L 21/6831; H01L 21/6833
See application file for complete search history.

(56) References Cited

U.S. PATENT DOCUMENTS

| | | | | |
|---|---|---|---|---|
| 8,555,810 | B2* | 10/2013 | Park ................. | H01J 37/32091 118/724 |
| 2010/0044974 | A1* | 2/2010 | Kenworthy ....... | H01L 21/68735 279/128 |
| 2010/0078899 | A1* | 4/2010 | Povolny ............ | H01J 37/32642 279/128 |
| 2012/0091108 | A1* | 4/2012 | Lin .................... | H01L 21/6831 219/201 |
| 2015/0043123 | A1* | 2/2015 | Cox .................. | H01L 21/67248 29/611 |
| 2017/0140957 | A1* | 5/2017 | Kitagawa ........... | H01L 21/6831 |

* cited by examiner

*Primary Examiner* — Gary A Nash
(74) *Attorney, Agent, or Firm* — ScienBiziP, P.C.

(57) ABSTRACT

A plasma processing system is disclosed. The plasma processing system includes an electrostatic chuck (ESC) and an edge ring assembly surrounding the ESC. The edge ring assembly includes a coupling ring and temperature modifying elements disposed within the coupling ring.

20 Claims, 6 Drawing Sheets

PLASMA PROCESSING SYSTEM

CROSS-REFERENCES TO RELATED APPLICATIONS

This application claims the benefit of U.S. Provisional Patent Application No. 62/778,932 filed on Dec. 13, 2018, which is hereby incorporated by reference herein and made a part of specification.

BACKGROUND

1. Field

The present disclosure generally relates plasma processing system, and more particularly, plasma processing system having temperature modifying elements in coupling ring.

2. Related Art

Generally, a semiconductor device is manufactured by performing a plurality of unit processes that include a deposition process and an etching process on a workpiece. The etching process may be performed in a semiconductor manufacture facility in which a plasma reaction is induced.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
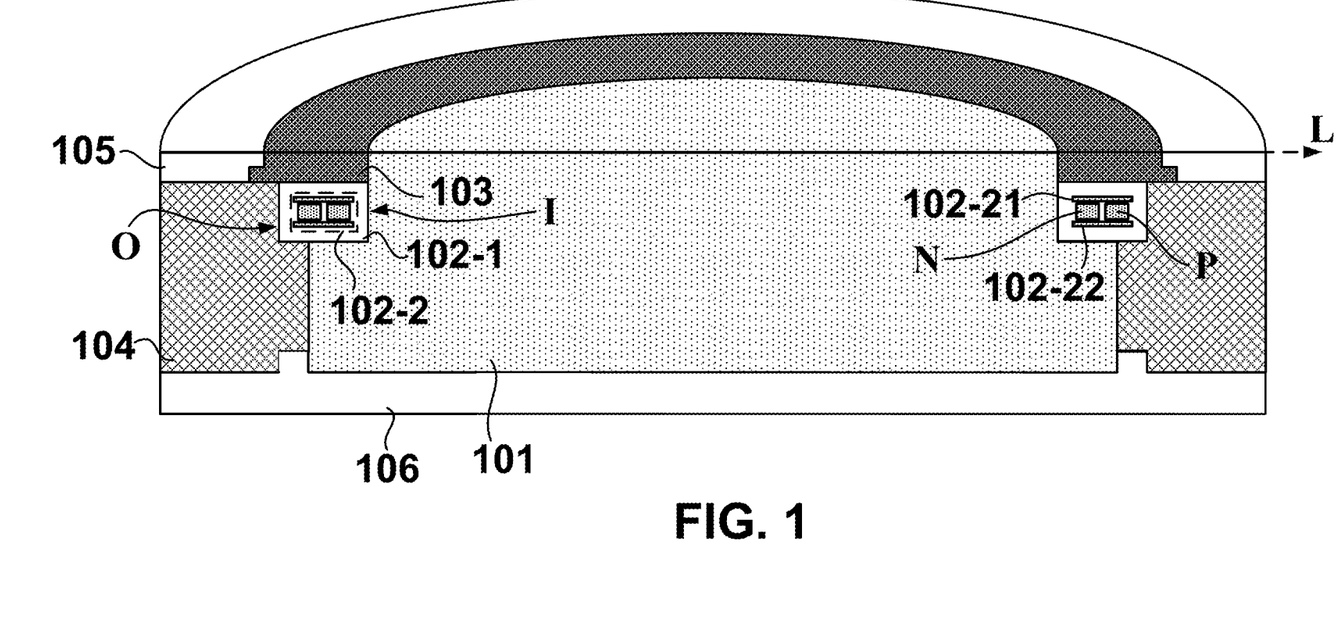
FIG. 1 illustrates a cross section of a plasma processing system according to some embodiments of the instant disclosure.
Figure 2:
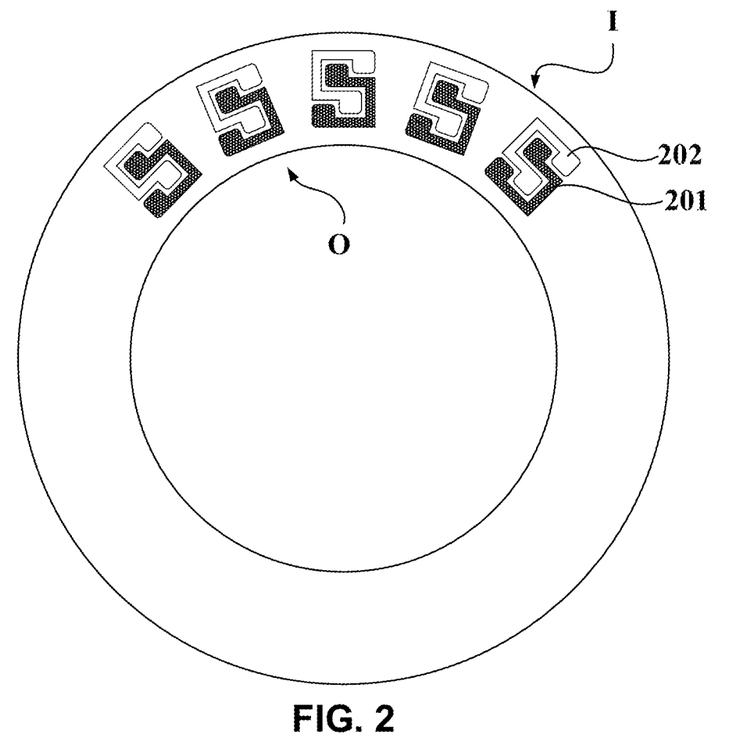
FIG. 2 illustrates a planar view of a coupling ring according to some embodiments of the instant disclosure.

FIG. 1 illustrates a cross section of a plasma processing system according to some embodiments of the instant disclosure. FIG. 2 illustrates a planar view of a coupling ring according to some embodiments of the instant disclosure. The plasma processing system includes an electrostatic chuck (ESC) 101 defining a plane L and an edge ring assembly surrounding the ESC 101. In some embodiments, a material of the electrostatic chuck (ESC) 101 includes aluminum. The edge ring assembly includes a coupling ring 102-1 and temperature modifying elements 102-2 disposed within the coupling ring 102-1. In some embodiments, the coupling ring 102-1 is disposed on a step edge of the ESC 101. In some embodiments, a material of the coupling ring 102-1 includes ceramic. The coupling ring 102-1 having an inner periphery I and an outer periphery O. In some embodiments, the temperature modifying elements 102-2 uses Peltier structure. The temperature modifying elements 102-2 includes a plurality of first temperature elements 201 and a plurality of second temperature elements 202. Each of the temperature modifying elements 102-2 have a first temperature side 102-21 and a second temperature side 102-22 projectively overlapping the first temperature side 102-21. In some embodiments, the first temperature sides 102-21 are hot-sides and the second temperature sides 102-22 are cold-sides. The first temperature sides 102-21 of the first temperature elements 201 are arranged to be planarly adjacent to the second temperature sides 102-22 of the second temperature elements 202. The plurality of the first temperature elements 201 are circumferentially distributed around the coupling ring at substantially equidistance. The plurality of the second temperature elements 202 are circumferentially distributed around the coupling ring at substantially equidistance. In some embodiments, each of the temperature modifying elements 102-2 includes first thermoelectric elements N and second thermoelectric elements P arranged to form a planar pattern. Conductive plates correspondingly electrically couple one of the first thermoelectric elements N and one of the second thermoelectric elements P in series. In some embodiments, the temperature modifying elements 102-2 is configured to control at least one of the temperature of the edge ring 103 and a portion of the ESC 101.

In some embodiments, the edge ring assembly further comprises an edge ring 103 disposed on the coupling ring 102-1. In some embodiments, a material of the edge ring 103 includes at least one of silicon, quartz, and ceramic. In some embodiments, the plasma processing system further comprises a quartz ring 104 surrounding the ESC 101 and a cover ring 105 disposed above the quartz ring 104. The ESC 101 and the quartz ring 104 are further disposed above an insulator 106. In some embodiments, a material of the cover ring 105 includes quartz. In some embodiments, a material of the insulator 106 includes ceramic.

When the plasma processing system is operating, a workpiece is placed on the ESC 101 at the plane L. In some embodiments, the workpiece includes silicon. Alternatively, the workpiece may include germanium, silicon germanium, gallium arsenide or other appropriate semiconductor materials. Also alternatively, the workpiece may include at least one of an epitaxial layer, a silicon wafer, and a silicon dioxide layer. In some embodiments, the temperature modifying elements 102-2 configured to control the temperature of the workpiece. In this way, a symmetrical temperature may be maintained throughout the work piece.

Figure 3A:
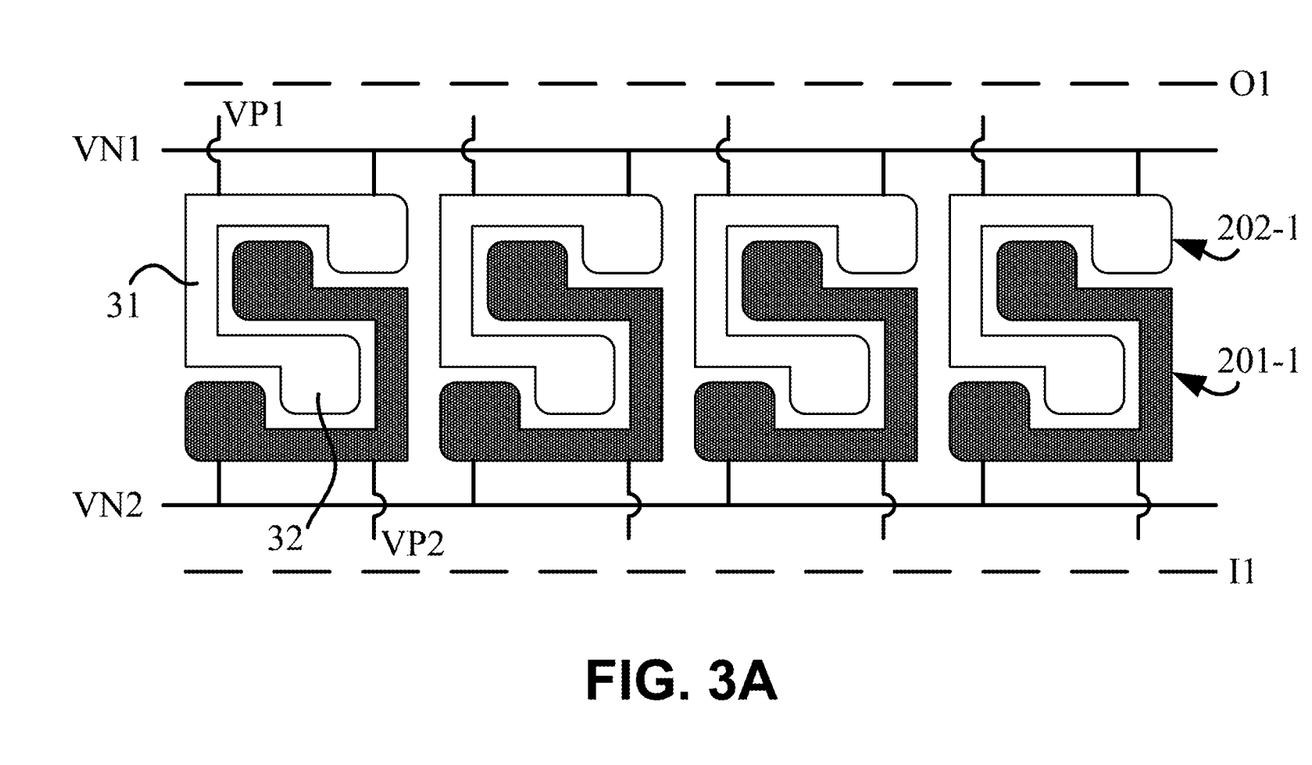
FIG. 3A-3D illustrates a planar view of temperature modifying elements according to some embodiments of the instant disclosure.

FIG. 3A-3D illustrates a planar view of temperature modifying elements according to some embodiments of the instant disclosure. As shown in FIG. 3A, the planar pattern of the temperature modifying elements includes a single bar note pattern having a U shaped stem 31 and two note ends 32 coupled to terminals of the U shaped stem 31. A first temperature element 201-1 of the plurality of first temperature elements 201-1 forms an interlocking pair with a corresponding second temperature element 202-1 of the plurality of second temperature elements 202-1. The first temperature element 201-1 is oriented with a 180° rotational phase difference with respect to an orientation of the second temperature element 202-1. In some embodiments, a surface of the first temperature element 201-1 formed closest to an inner periphery I1 of the coupling ring is substantially tangential to the inner periphery I1. In some embodiments, a surface of the second temperature element 202-1 formed closest to an outer periphery O1 of the coupling ring is substantially tangential to the outer periphery O1.

In some embodiments, each of the temperature modifying elements 102-2 further comprises a first terminal VP1, VP2 and a second terminal VN1, VN2. The first terminal VP2 and the second terminal VN2 of the plurality of first temperature elements 201-1 are protruding away from a portion of the first temperature element 201-1 formed closest to the inner periphery I1 of the coupling ring. The first terminal VP1 and the second terminal VN1 of the plurality of second temperature elements 202-1 are protruding away from a portion of the second temperature element 202-1 formed closest to the outer periphery O1 of the coupling ring.

In some embodiments, the temperature modifying elements are individually controlled. The first terminal VP1, VP2 of the temperature modifying elements are individually coupled to a controller. The second terminal VN2 of the plurality of first temperature elements 201-1 are coupled to each other and simultaneously coupled to the controller. The second terminal VN1 of the plurality of second temperature elements 202-1 are coupled to each other and simultaneously coupled to the controller. The disclosure is not limited thereto. In some embodiments, the second terminal VN1, VN2 of the temperature modifying elements are further individually coupled to a controller. In some embodiments, the first terminal VP1 is electrically coupled to a positive voltage source and the second terminal VN1 is electrically coupled to a negative voltage source. In some embodiments, the first terminal VP2 is electrically coupled to a positive voltage source and the second terminal VN2 is electrically coupled to a negative voltage source.

Figure 3B:
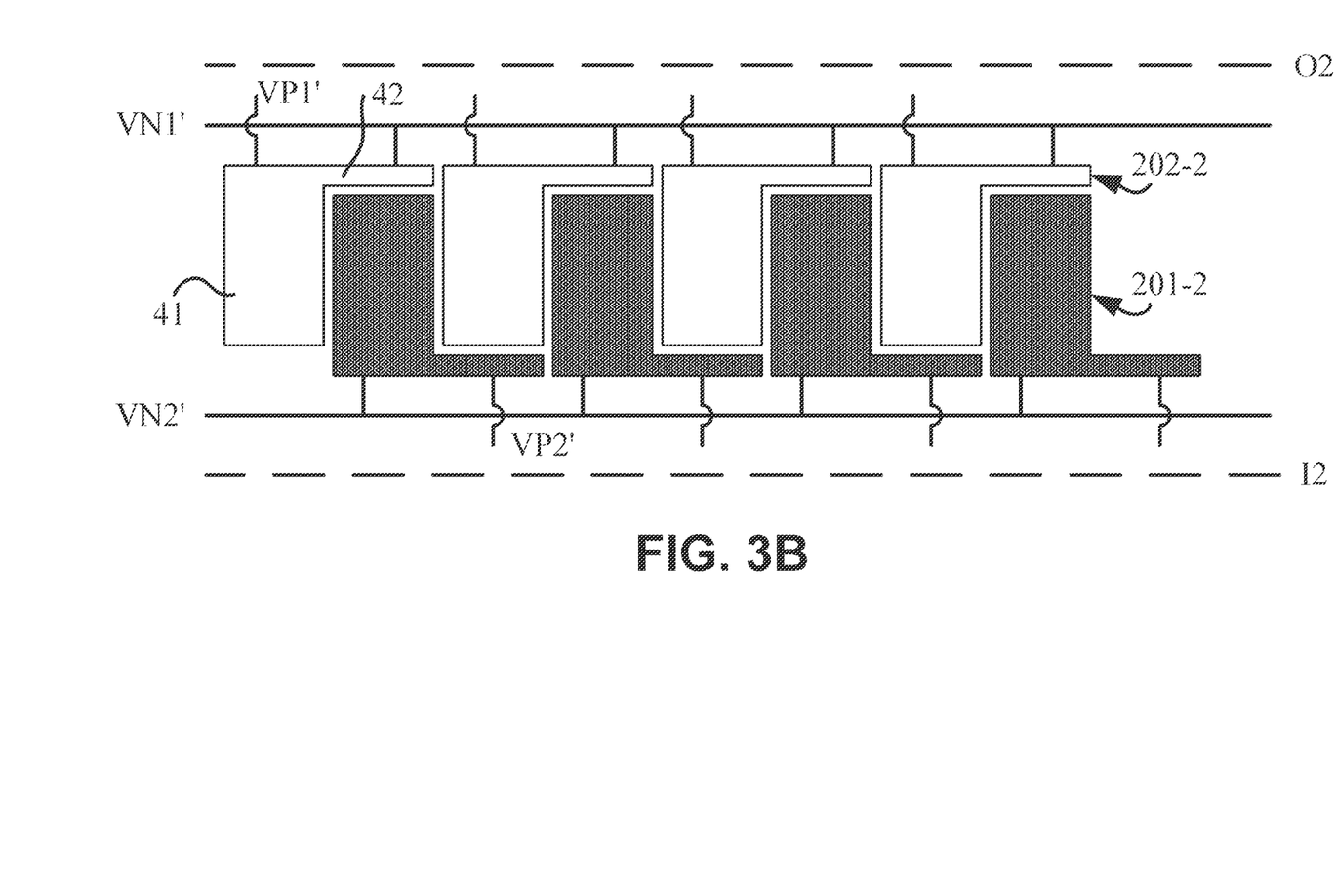

As shown in FIG. 3B, the planar pattern of the temperature modifying elements includes a L shape pattern having a radial segment 41 and a tangential segment 42 substantially perpendicular to the radial segment 41. The radial segment 41 of the plurality of first temperature elements 201-2 extends away from an inner periphery I2 of the coupling ring. The tangential segment 42 of the first temperature elements 201-2 extends in a clockwise direction along the inner periphery I2 of the coupling ring. The radial segment 41 of the second temperature elements 202-2 extends away from an outer periphery O2 of the coupling ring. The tangential segment 42 of the second temperature elements 202-2 extends in a clockwise direction along the outer periphery O2 of the coupling ring. The radial segment 41 of the plurality of second temperature elements 202-2 is disposed between radial segments 41 of two neighboring first temperature elements 201-2. In some embodiments, the tangential segment 42 of the first temperature elements 201-2 is substantially tangential to the inner periphery I2 of the coupling ring. In some embodiments, the tangential segment 42 of the second temperature elements 202-2 is substantially tangential to the outer periphery O2 of the coupling ring.

In some embodiments, each of temperature modifying elements 201-2, 202-2 further comprises a first terminal VP1', VP2' and a second terminal VN1', VN2'. The first terminal VP2' and the second terminal VN2' of each of the plurality of first temperature elements 201-2 are protruding away from the first temperature element 201-2 and towards an inner periphery I2 of the coupling ring. The first terminal VP1' and the second terminal VN1' of each of the plurality of second temperature elements 202-2 are protruding away from the second temperature element 202-2 and towards an outer periphery O2 of the coupling ring.

In some embodiments, the temperature modifying elements are individually controlled. The first terminal VP1', VP2' of the temperature modifying elements are individually coupled to a controller. The second terminal VN2' of the plurality of first temperature elements 201-2 are coupled to each other and simultaneously coupled to the controller. The second terminal VN1' of the plurality of second temperature elements 202-2 are coupled to each other and simultaneously coupled to the controller. The disclosure is not limited thereto. In some embodiments, the second terminal VN1', VN2' of the temperature modifying elements are further individually coupled to a controller.

Figure 3C:
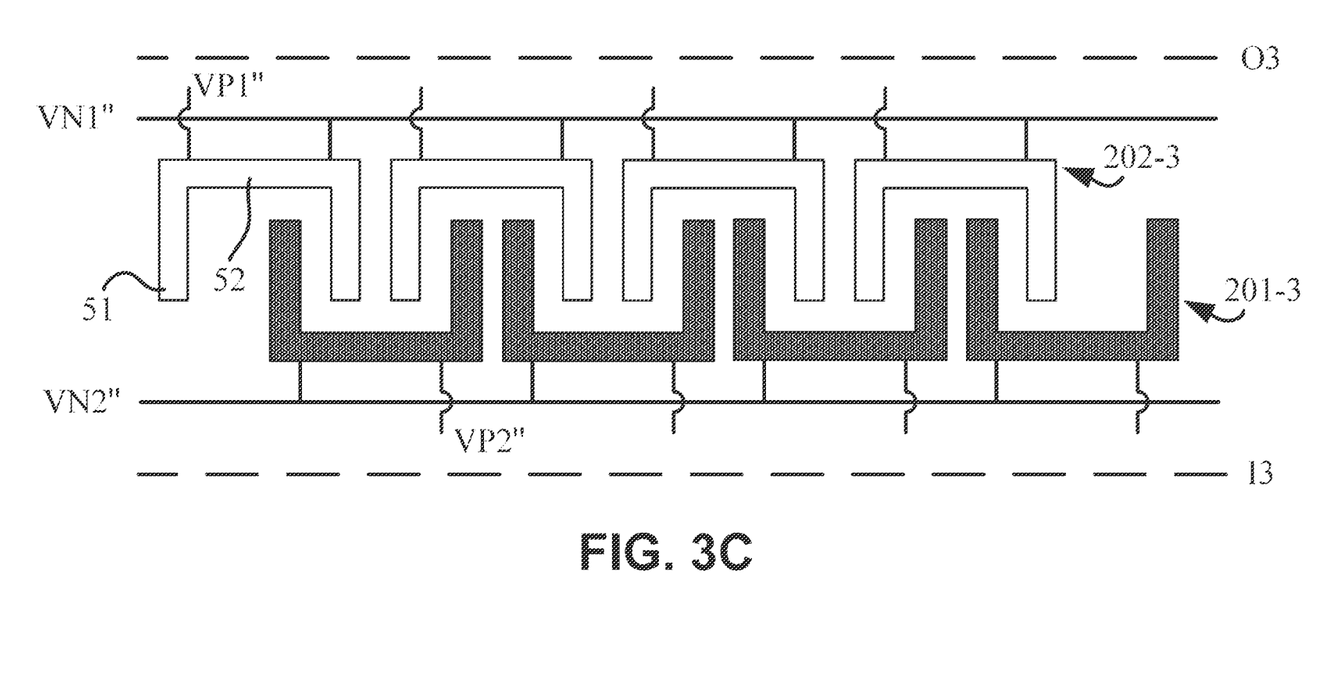

As shown in FIG. 3C, the planar pattern of the temperature modifying elements includes a U shape pattern. The U shape pattern have two stems 51 coupled to each other through a bar 52. The two stems 51 of the plurality of first temperature elements 201-3 extends away from an inner periphery I3 of the coupling ring. The bar 52 of the first temperature elements 201-3 formed along the inner periphery I3 of the coupling ring. In some embodiments, a surface of the bar 52 of the first temperature elements 201-3 is substantially tangential to the inner periphery I3 of the coupling ring. The two stems 51 of the plurality of second temperature elements 202-3 extends away from an outer periphery O3 of the coupling ring. The bar 52 of the second temperature elements 202-3 formed along the outer periphery O3 of the coupling ring. In some embodiments, a surface of the bar 52 of the second temperature elements 202-3 is substantially tangential to the outer periphery O3 of the coupling ring. Neighboring stems 51 of neighboring first temperature elements 201-3 are disposed between the two stems 51 of one of the second temperature elements 202-3. Neighboring stems 51 of neighboring second temperature elements 202-3 are disposed between the two stems 51 of one of the first temperature elements 201-3.

In some embodiments, each of temperature modifying elements 201-3, 202-3 further comprises a first terminal VP1", VP2" and a second terminal VN1", VN2". The first terminal VP2" and the second terminal VN2" of each of the plurality of first temperature elements 201-3 are protruding away from the plurality of first temperature elements 201-3 and towards an inner periphery I3 of the coupling ring. The first terminal VP1" and the second terminal VN1" of each of the plurality of second temperature elements 202-3 are protruding away from the plurality of second temperature elements 202-3 and towards an outer periphery O3 of the coupling ring.

In some embodiments, the temperature modifying elements are individually controlled. The first terminal VP1", VP2" of the temperature modifying elements are individually coupled to a controller. The second terminal VN2" of the plurality of first temperature elements 201-3 are coupled to each other and simultaneously coupled to the controller. The second terminal VN1" of the plurality of second temperature elements 202-3 are coupled to each other and simultaneously coupled to the controller. The disclosure is not limited thereto. In some embodiments, the second terminal VN1", VN2" of the temperature modifying elements are further individually coupled to a controller.

Figure 3D:
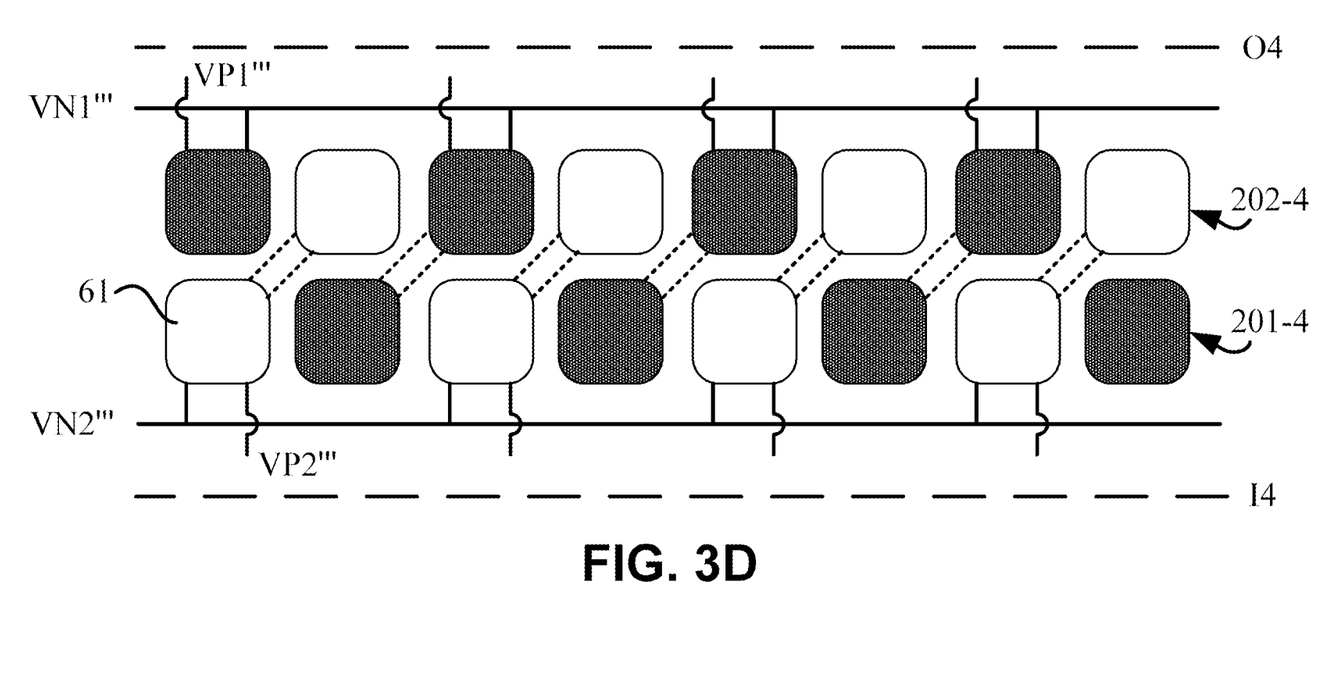

As shown in FIG. 3D, the planar pattern of the temperature modifying elements includes a polygonal shape 61. The polygonal shape 61 includes at least one of square, rectangle, round, trapezoid, oval and diamond. The plurality of first temperature elements 201-4 and the plurality of second temperature elements 202-4 are arranged in two rows in an alternating way to form a checkered pattern.

Each of temperature modifying elements further comprises a first terminal VP1''', VP2''' and a second terminal VN1''', VN2'''. The first terminal VP2''' and the second terminal VN2''' of the plurality of first temperature elements 201-4 extends towards an inner periphery I4 of the coupling ring. The first terminal VP1''' and the second terminal VN1''' of the plurality of second temperature elements 202-4 extends towards an outer periphery O4 of the coupling ring.

In some embodiments, the temperature modifying elements are individually controlled. The first terminal VP1''', VP2''' of the temperature modifying elements are individually coupled to a controller. The second terminal VN2''' of the plurality of first temperature elements 201-4 are coupled to each other and simultaneously coupled to the controller. The second terminal VN1''' of the plurality of second temperature elements 202-4 are coupled to each other and simultaneously coupled to the controller. The disclosure is not limited thereto. In some embodiments, the second terminal VN1''', VN2''' of the temperature modifying elements are further individually coupled to a controller. In some embodiments, the first temperature elements 201-4 disposed closer to the inner periphery I4 of the coupling ring is coupled to a corresponding first temperature elements 201-4 disposed closer to the outer periphery O4 of the coupling ring. The first temperature elements 201-4 disposed closer to the inner periphery I4 of the coupling ring are controlled through the first terminal VP1''' and the second terminal VN1''' of the first temperature elements 201-4 disposed closer to the outer periphery O4 of the coupling ring. In some embodiments, the second temperature elements 202-4 disposed closer to the outer periphery O4 of the coupling ring is coupled to a corresponding second temperature elements 202-4 disposed closer to the inner periphery I4 of the coupling ring. The second temperature elements 202-4 disposed closer to the outer periphery O4 of the coupling ring are controlled through the first terminal VP2''' and the second terminal VN2''' of the second temperature elements 202-4 disposed closer to the inner periphery I4 of the coupling ring.

In some embodiments, temperature sensors are disposed adjacent to the temperature elements to allow individual control of each of the temperature elements. In this way, the temperature in different areas of the edge ring are precisely and selectively controlled.

Accordingly, one aspect of the instant disclosure provides a plasma processing system for processing a wafer that comprises an electrostatic chuck (ESC) defining a plane; and an edge ring assembly surrounding the ESC. The edge ring assembly comprises a coupling ring disposed on a step edge of the ESC; and temperature modifying elements disposed within the coupling ring, including a plurality of first temperature elements and a plurality of second temperature elements, each of the temperature modifying elements having a first temperature side and a second temperature side projectively overlapping each other. The first temperature sides of the first temperature elements are arranged to be planarly adjacent to the second temperature sides of the second temperature elements. The plurality of the first temperature elements are circumferentially distributed around the coupling ring at substantially equidistance. The plurality of the second temperature elements are circumferentially distributed around the coupling ring at substantially equidistance.

In some embodiments, each of the temperature modifying elements comprises first thermoelectric elements and second thermoelectric elements arranged to form a planar pattern; and conductive plates correspondingly electrically coupling one of the first thermoelectric elements and one of the second thermoelectric elements in series.

In some embodiments, the planar pattern includes a single bar note pattern having two note ends coupled to terminals of a U shaped stem.

In some embodiments, a first temperature element of the plurality of first temperature elements forms an interlocking pair with a second temperature element of the plurality of second temperature elements. The first temperature element is oriented with a 180° rotational phase difference with respect to an orientation of the second temperature element.

In some embodiments, each of the temperature modifying elements further comprises a first terminal and a second terminal. The first terminal and the second terminal of the plurality of first temperature elements are protruding away from a portion of the first temperature element formed closest to an inner periphery of the coupling ring. The first terminal and the second terminal of the plurality of second temperature elements are protruding away from a portion of the second temperature element formed closest to an outer periphery of the coupling ring.

In some embodiments, the planar pattern includes a L shape pattern having a radial segment and a tangential segment substantially perpendicular to the radial segment.

In some embodiments, the radial segment of the plurality of first temperature elements extends away from an inner periphery of the coupling ring. The tangential segment of the plurality of first temperature elements extends in a clockwise direction along the inner periphery of the coupling ring. The radial segment of the second temperature elements extends away from an outer periphery of the coupling ring. The tangential segment of the plurality of the second temperature elements extends in a clockwise direction along the outer periphery of the coupling ring. The radial segment of the plurality of second temperature elements is disposed between radial segments of two neighboring first temperature elements.

In some embodiments, each of temperature modifying elements further comprises a first terminal and a second terminal. The first terminal and the second terminal of each of the plurality of first temperature elements are protruding away from the first temperature element and towards an inner periphery of the coupling ring. The first terminal and the second terminal of each of the plurality of second temperature elements are protruding away from the second temperature element and towards an outer periphery of the coupling ring.

In some embodiments, the planar pattern includes a U shape pattern, the U shape pattern having two stems coupled to each other through a bar.

In some embodiments, the two stems of the plurality of first temperature elements extends away from an inner periphery of the coupling ring. The bar of the plurality of first temperature elements formed along the inner periphery of the coupling ring. The two stems of the plurality of second temperature elements extends away from an outer periphery of the coupling ring. The bar of the plurality of second temperature elements formed along the outer periphery of the coupling ring. Neighboring stems of neighboring first temperature elements of the plurality of first temperature elements are disposed between the two stems of one of the plurality of second temperature elements.

In some embodiments, each of temperature modifying elements further comprises a first terminal and a second terminal. The first terminal and the second terminal of each of the plurality of first temperature elements are protruding away from the plurality of first temperature elements and towards an inner periphery of the coupling ring. The first terminal and the second terminal of each of the plurality of second temperature elements are protruding away from the plurality of second temperature elements and towards an outer periphery of the coupling ring.

In some embodiments, the planar pattern of the temperature modifying elements includes a polygonal shape.

In some embodiments, the plurality of first temperature elements and the plurality of second temperature elements are arranged in two rows in an alternating way to form a checkered pattern.

In some embodiments, each of temperature modifying elements further comprises a first terminal and a second terminal. The first terminal and the second terminal of the plurality of first temperature elements extends towards an inner periphery of the coupling ring. The first terminal and the second terminal of the plurality of second temperature elements extends towards an outer periphery of the coupling ring.

In some embodiments, the edge ring assembly further comprises an edge ring disposed on the coupling ring.

In some embodiments, the first temperature sides are hot-sides and the second temperature sides are cold-sides.

In some embodiments, the temperature modifying elements are individually controlled.

Accordingly, another aspect of the instant disclosure provides a plasma processing system for processing a wafer that comprises an electrostatic chuck (ESC); and an edge ring assembly surrounding the ESC. The edge ring assembly comprises a coupling ring disposed on a step edge of the ESC; temperature modifying elements includes a plurality of paired temperature elements, each temperature element of the plurality of paired temperature elements having a first temperature side and a second temperature side projectively overlapping to the first temperature side, each of the paired temperature elements having a first temperature element and a second temperature element, the first temperature element having a vertically reversed orientation from the second temperature element; and an edge ring disposed on the coupling ring.

In some embodiments, the first temperature element and the second temperature element respective define patterns that interlocks each other.

In some embodiments, the edge ring assembly further comprises control terminals disposed in the coupling ring. The first temperature element of the temperature modifying elements being electrically coupled to the control terminals disposed in an inner periphery of the coupling ring. The second temperature element of the temperature modifying elements being electrically coupled to the control terminals disposed in an outer periphery of the coupling ring. The first temperature elements and the second temperature elements are individually controlled from each other.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A plasma processing system for processing a wafer, comprising:
   an electrostatic chuck (ESC) defining a plane; and
   an edge ring assembly surrounding the ESC, the edge ring assembly comprising:
      a coupling ring disposed on a step edge of the ESC; and
      temperature modifying elements disposed within the coupling ring, including a plurality of first temperature elements and a plurality of second temperature elements, each of the temperature modifying elements having a first temperature side and a second temperature side projectively overlapping each other;
      wherein the first temperature sides of the first temperature elements are arranged to be planarly adjacent to the second temperature sides of the second temperature elements;
      wherein the plurality of the first temperature elements are circumferentially distributed around the coupling ring at substantially equidistance; and
      wherein the plurality of the second temperature elements are circumferentially distributed around the coupling ring at substantially equidistance.

2. The system of claim 1, wherein each of the temperature modifying elements comprises:
   first thermoelectric elements and second thermoelectric elements arranged to form a planar pattern; and
   conductive plates correspondingly electrically coupling one of the first thermoelectric elements and one of the second thermoelectric elements in series.

3. The system of claim 2, wherein the planar pattern includes a single bar note pattern having two note ends coupled to terminals of a U shaped stem.

4. The system of claim 3, wherein a first temperature element of the plurality of first temperature elements forms an interlocking pair with a second temperature element of the plurality of second temperature elements;
   wherein the first temperature element is oriented with a 180° rotational phase difference with respect to an orientation of the second temperature element.

5. The system of claim 3, wherein each of the temperature modifying elements further comprises a first terminal and a second terminal,
   wherein the first terminal and the second terminal of the plurality of first temperature elements are protruding away from a portion of the first temperature element formed closest to an inner periphery of the coupling ring, wherein the first terminal and the second terminal of the plurality of second temperature elements are protruding away from a portion of the second temperature element formed closest to an outer periphery of the coupling ring.

6. The system of claim 2, wherein the planar pattern includes a L shape pattern having a radial segment and a tangential segment substantially perpendicular to the radial segment.

7. The system of claim 6, wherein the radial segment of the plurality of first temperature elements extends away from an inner periphery of the coupling ring, the tangential segment of the plurality of first temperature elements extends in a clockwise direction along the inner periphery of the coupling ring, the radial segment of the second temperature elements extends away from an outer periphery of the coupling ring, the tangential segment of the plurality of the second temperature elements extends in a clockwise direction along the outer periphery of the coupling ring, wherein the radial segment of the plurality of second temperature elements is disposed between radial segments of two neighboring first temperature elements.

8. The system of claim 6, wherein each of temperature modifying elements further comprises a first terminal and a second terminal, wherein the first terminal and the second terminal of each of the plurality of first temperature elements are protruding away from the first temperature element and towards an inner periphery of the coupling ring, wherein the first terminal and the second terminal of each of the plurality of second temperature elements are protruding away from the second temperature element and towards an outer periphery of the coupling ring.

9. The system of claim 2, wherein the planar pattern includes a U shape pattern, the U shape pattern having two stems coupled to each other through a bar.

10. The system of claim 9, wherein the two stems of the plurality of first temperature elements extends away from an inner periphery of the coupling ring, the bar of the plurality of first temperature elements formed along the inner periphery of the coupling ring, the two stems of the plurality of second temperature elements extends away from an outer periphery of the coupling ring, the bar of the plurality of second temperature elements formed along the outer periphery of the coupling ring, wherein neighboring stems of neighboring first temperature elements of the plurality of first temperature elements are disposed between the two stems of one of the plurality of second temperature elements.

11. The system of claim 9, wherein each of temperature modifying elements further comprises a first terminal and a second terminal, wherein the first terminal and the second terminal of each of the plurality of first temperature elements are protruding away from the plurality of first temperature elements and towards an inner periphery of the coupling ring, wherein the first terminal and the second terminal of each of the plurality of second temperature elements are protruding away from the plurality of second temperature elements and towards an outer periphery of the coupling ring.

12. The system of claim 2, wherein the planar pattern of the temperature modifying elements includes a polygonal shape.

13. The system of claim 12, wherein the plurality of first temperature elements and the plurality of second temperature elements are arranged in two rows in an alternating way to form a checkered pattern.

14. The system of claim 13, wherein each of temperature modifying elements further comprises a first terminal and a second terminal, wherein the first terminal and the second terminal of the plurality of first temperature elements extends towards an inner periphery of the coupling ring, wherein the first terminal and the second terminal of the plurality of second temperature elements extends towards an outer periphery of the coupling ring.

15. The system of claim 1, wherein the edge ring assembly further comprises:

an edge ring disposed on the coupling ring.

16. The system of claim 1, wherein the first temperature sides are hot-sides and the second temperature sides are cold-sides.

17. The system of claim 1, wherein the temperature modifying elements are individually controlled.

18. A plasma processing system for processing a wafer, comprising:

an electrostatic chuck (ESC); and an edge ring assembly surrounding the ESC, the edge ring assembly comprising:

a coupling ring disposed on a step edge of the ESC;

temperature modifying elements includes a plurality of paired temperature elements, each temperature element of the plurality of paired temperature elements having a first temperature side and a second temperature side projectively overlapping to the first temperature side, each of the paired temperature elements having a first temperature element and a second temperature element, the first temperature element having a vertically reversed orientation from the second temperature element; and an edge ring disposed on the coupling ring.

19. The system of claim 18, wherein the first temperature element and the second temperature element respective define patterns that interlocks each other.

20. The system of claim 18, wherein the edge ring assembly further comprising:

control terminals disposed in the coupling ring;

wherein the first temperature element of the temperature modifying elements being electrically coupled to the control terminals disposed in an inner periphery of the coupling ring, wherein the second temperature element of the temperature modifying elements being electrically coupled to the control terminals disposed in an outer periphery of the coupling ring, wherein the first temperature elements and the second temperature elements are individually controlled from each other.

* * * * *